United States Patent [19]
Han et al.

[11] Patent Number: 6,062,799
[45] Date of Patent: May 16, 2000

[54] APPARATUS AND METHOD FOR AUTOMATICALLY LOADING OR UNLOADING PRINTED CIRCUIT BOARDS FOR SEMICONDUCTOR MODULES

[75] Inventors: Seong Chan Han; Dong Chun Lee; Kwang Su Yu; O Kyung Kwon, all of Asan, Rep. of Korea

[73] Assignee: Samsung Electronics Co., Ltd., Kyungki-do, Rep. of Korea

[21] Appl. No.: 09/103,518

[22] Filed: Jun. 23, 1998

[51] Int. Cl.[7] .................................................. B65G 49/05
[52] U.S. Cl. .................... 414/416; 414/225.01; 414/778; 414/806; 414/811; 414/816; 198/409; 198/465.1; 198/867.05
[58] Field of Search ................ 414/222.01, 222.09, 414/225.01, 403, 416, 778, 783, 806, 811, 816; 198/409, 465.1, 465.2, 867.05; 206/706; 901/8

[56] References Cited

U.S. PATENT DOCUMENTS

| | | | |
|---|---|---|---|
| 4,226,569 | 10/1980 | Gerard et al. ........................ | 414/783 X |
| 4,557,371 | 12/1985 | Yonezawa .......................... | 198/867.05 |
| 4,621,967 | 11/1986 | Masada .............................. | 414/403 X |
| 4,725,182 | 2/1988 | Sakamoto et al. ............... | 198/465.1 X |
| 4,850,104 | 7/1989 | Matrone et al. .................... | 414/806 X |
| 5,060,781 | 10/1991 | Santandrea et al. ............. | 198/465.2 X |
| 5,313,156 | 5/1994 | Klug et al. ........................... | 414/416 X |
| 5,593,040 | 1/1997 | Shelton et al. .......................... | 206/706 |
| 5,675,957 | 10/1997 | Kim ............................... | 414/225.01 X |
| 5,732,465 | 3/1998 | Tokita et al. ........................ | 206/707 X |
| 5,927,504 | 7/1999 | Han et al. ............................... | 206/706 |

*Primary Examiner*—James W. Keenan
*Attorney, Agent, or Firm*—Skjerven, Morrill, MacPherson, Franklin & Friel LLP; David T. Millers

[57] ABSTRACT

An apparatus for automatic loading or unloading printed circuit boards (PCBs) for semiconductor modules is disclosed. The apparatus employs an elastic jig carrier into which the PCBs are loaded. The jig carrier includes movable clamps for fixing the PCBs by elastic force. A jig opener of the apparatus applies opening force, in the reverse direction of the elastic force, to the movable clamps so that the PCBs can be loaded into or unloaded from the jig carrier by a picker. The jig carrier is transferred along a conveyor belt, while the PCBs are supplied from a PCB stage such as a tray to the jig carrier. The apparatus may further comprise a gripper and a rotator. The gripper grips the upright PCBs and the rotator rotates them to be horizontal, so that the picker can pick up the horizontal PCBs. The apparatus may also comprise an aligner for exact alignment of the PCBs in the jig carrier. A method for loading or unloading the PCBs into or from the jig carrier is also disclosed in connection with the apparatus.

16 Claims, 11 Drawing Sheets

6,062,799

APPARATUS AND METHOD FOR AUTOMATICALLY LOADING OR UNLOADING PRINTED CIRCUIT BOARDS FOR SEMICONDUCTOR MODULES

BACKGROUND OF THE INVENTION

1. Field of the Invention

The present invention relates generally to an apparatus and a method employed in manufacture of semiconductor modules. More particularly, the present invention relates to automatically loading or unloading multiple printed circuit boards into or from a jig carrier during a process of manufacturing semiconductor modules.

2. Description of the Prior Art

As electronic devices become more complex and employ more integrated circuits, it is desirable, if possible, to avoid increasing the space they occupy. To solve this problem, modules mounted with multiple integrated circuit devices have been employed. In a typical module, the integrated circuit devices, for example, semiconductor packages, are attached to either one side of a printed circuit board (PCB) in case of a single-sided module or both sides of PCB in case of a double-sided module.

For higher productivity, modules are generally produced in a production line where PCBs move along conveyor belt. In particular, sheet-type PCBs are subjected to module manufacturing processes that are well known in the art. In such processes, each sheet-type PCB has a number of individual PCBs, what are called piece-type PCBs, which are linked with each other at their ends, leaving space between adjacent individual PCBs. Final modules, each including a single individual PCB, are obtained by cutting the link parts of the sheet-type PCBs after completing the process.

However, the use of the sheet-type PCBs raises some problems. One problem is that the sheet-type PCBs include wasted parts, such as link parts or space. These wasted parts are required during the manufacturing process, but not required in the final product. Moreover, although unexpected failure may be found among the individual PCBs composing one sheet-type PCB during the manufacturing process, the failed PCBs are subjected to the final steps of the process because of the difficulty in removing the failed PCBs. This can significantly reduce productivity.

Accordingly, in recent years, individual PCBs without the link part or space are separated at the beginning of the module manufacturing process. This can reduce the per the unit cost of modules because the absence of the link part or space reduces the required amount of raw PCB materials. A jig carrier makes this improvement possible. That is to say, the jig carrier can not only carry a large number of individual PCBs, but also provides better productivity than the sheet-type PCB processes.

FIG. 1 is a perspective view of a jig carrier 10 as a conventional apparatus for carrying PCBs 20 for semiconductor modules; and FIG. 2 is a perspective view for schematically showing a typical PCB 20 for a semiconductor module.

As shown in FIGS. 1 and 2, the known jig carrier 10 comprises a rectangular frame 12 and two opposite plates 14 inside the frame 12. Pins 6 are formed at regular intervals on the plates 14. The PCB 20 is a rectangular panel having two opposite shorter edges 21 and two opposite longer edges 22. The PCB 20 includes a number of circuit patterns, not shown, formed on both top and bottom surfaces thereof, as widely known in the art. The PCB 20 further comprises through holes 26 corresponding to the pins 16 of the jig carrier 10.

When the PCB 20 is loaded in the jig carrier 10, the plates 14 of the jig carrier 10 support the bottom surface of the PCB 20, and the pins 16 are inserted into the through holes 26. After all PCBs 20 are loaded into the jig carrier 10, adhesive tape 18 is stuck to both top surfaces of the PCB 20 and the jig carrier 10, so that the PCB 20 is fixed to the jig carrier 10.

A disadvantage of the existing jig carrier 10 is that attaching the tape 18 and the loading of the PCBs 20 are done manually. In addition, in case of the double-sided module, the adhesive tape 18 must be removed from the PCBs 20 and the PCBs 20 are flipped over in the jig carrier 10 for attachment of other devices onto the back side of the PCB 20. The required manual manipulations reduce the productivity of the module manufacturing process. Additionally, different kinds and sizes of PCBs 20 are employed in different modules. The different PCBs 20 require different jig carriers 10. Thus, the use of a jig carrier 10 is limited by the size of its frame 12 and the position of its pins 16.

SUMMARY OF THE INVENTION

It is therefore an object of the present invention to provide an improved apparatus allowing automatically loading or unloading printed circuit boards into or from an invented carrier in the manufacture of semiconductor modules.

It is another object of the present invention to provide an improved method for automatically loading or unloading printed circuit boards into or from an invented carrier.

These and other objects in accordance with the present invention are attained by an apparatus comprising a jig opener and a picker, and by employing an elastic jig carrier into which a plurality of printed circuit boards (PCBs) are loaded. The elastic jig carrier includes receivers and a support plate for supporting the PCBs, and movable clamps for fixing the PCBs by elastic force. The jig opener of the apparatus applies opening force, in the reverse direction of the elastic force, to the movable clamps so that the PCBs can be loaded into or unloaded from the jig carrier by the picker. After loading, the PCBs are fixed by the elastic force in the absence of the opening force.

The apparatus of the present invention comprises a PCB stage where the PCBs are supplied for loading. The PCBs horizontally lie in the PCB stage, with one of the plane surfaces of each PCB facing upward. The loading apparatus further comprises a jig stage where the jig carrier is supplied and a conveyor belt for transferring the jig carrier from the jig stage. Either the PCB stage or the jig stage can be used as a storing stage of the PCBs or the jig carrier in the unloading apparatus.

The jig opener is located under the conveyor belt and opens the movable clamps when the jig carrier has been transferred along the conveyor belt for loading or unloading. In particular, each of the movable clamps may have a hole vertically formed therethrough, while the jig opener has opening pins which are inserted into corresponding holes in the movable clamps. The opening pins move the clamps by mechanical force.

The picker picks up the PCBs from the PCB stage and then places the PCBs into the jig carrier, above the jig opener. In particular, the picker picks up and places the PCBs so that the PCBs are horizontal in the jig carrier. The picker can be used to load the PCBs into the jig carrier from another stage, for example, a tray stage. Furthermore, the picker can unload the PCBs from the jig carrier.

The apparatus according to the present invention may further comprise the tray stage where a tray is supplied. The tray employed for the loader contains second PCBs, while the tray employed for the unloader will store the PCBs. The second PCBs, in which, for example, multiple integrated circuit devices are attached onto a plane surface, may stand upright in the tray, the plane surfaces of the second PCBs facing sideways.

When the apparatus of the invention employs the tray, the apparatus further comprises a gripper and a rotator. In the loader, the gripper grips the short edges of the PCBs in the tray so that the PCBs will be transferred upright, running from the tray stage to the picker. The rotator, which is located between the gripper and the picker, receives the upright PCBs from the gripper and then rotates the PCBs to horizontal so that the picker can pick up the horizontal PCBs. For the unloader, the gripper transfers the rotated PCBs from the rotator to the tray.

Furthermore, the apparatus according to the present invention may comprise an aligner. The aligner is located between the jig opener and module manufacturing line requiring the PCBs-loaded jig carrier. Therefore, the aligner may not be required for the unloader of the present invention.

According to an alternate aspect of the present invention, a method for automatically loading the PCBs into the jig carrier or automatically unloading the PCBs from the jig carrier is provided. The loading method comprises the steps of supplying the PCBs, supplying and transferring the jig carrier, opening the jig carrier by the jig opener, loading the PCBs into the opened jig carrier by the picker, and closing the jig carrier in order to fix the PCBs.

The loading method may further comprise the steps of supplying the tray containing the upright second PCBs, gripping the second PCBs in the tray by the gripper, and rotating the upright second PCBs by the rotator so that the horizontal second PCBs will be provided for the picker. The loading method may also comprise a step of aligning the PCBs by the aligner after closing the jig carrier.

On the other hand, the unloading method comprises steps of transferring the jig carrier to the jig opener along the conveyor belt, supplying the empty tray, opening the jig carrier by the jig opener, unloading the PCBs from the opened jig carrier by the picker, rotating the PCBs to an upright orientation by the rotator, and gripping the upright PCBs and then placing into the tray by the gripper.

BRIEF DESCRIPTION OF THE DRAWINGS

In the drawings, like reference numbers refer to like elements.

DETAILED DESCRIPTION OF THE PRESENT INVENTION

The present invention will now be described more fully hereinafter with reference to accompanying drawings, in which preferred embodiments of the invention are shown. This invention may, however, be embodied in many different forms and should not be construed as limited to the embodiments set forth herein.

Figure 1:
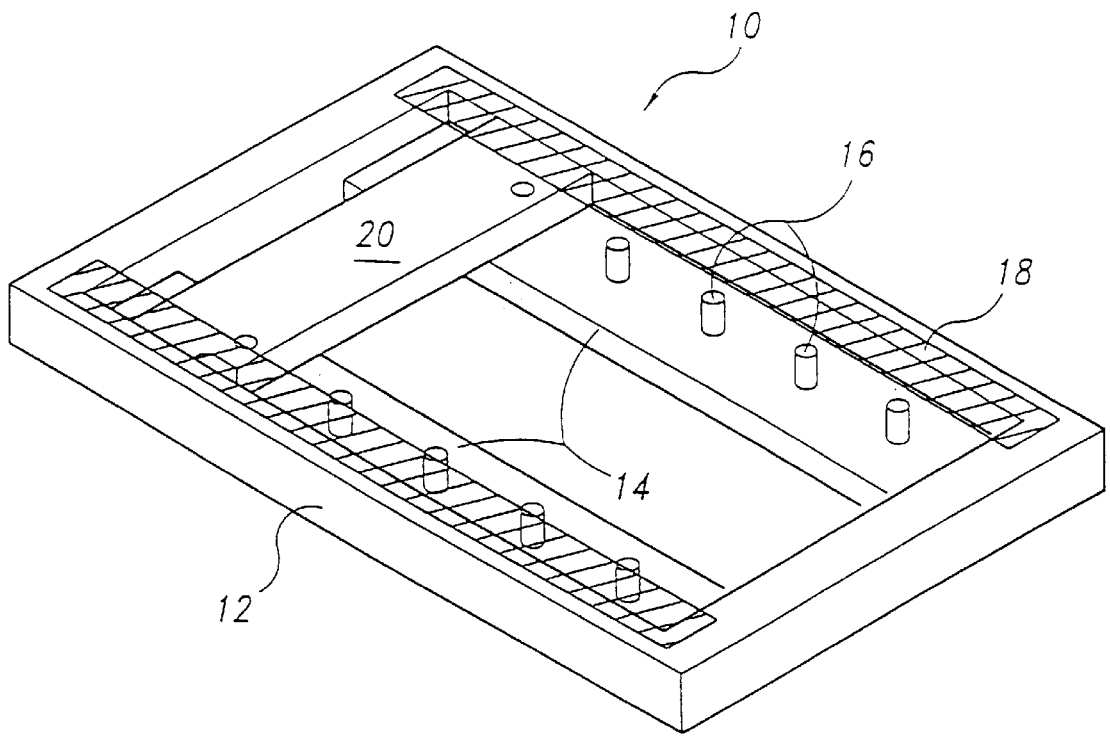
FIG. 1 is a perspective view of a conventional jig for carrying PCBs for manufacturing of semiconductor modules.
Figure 2:
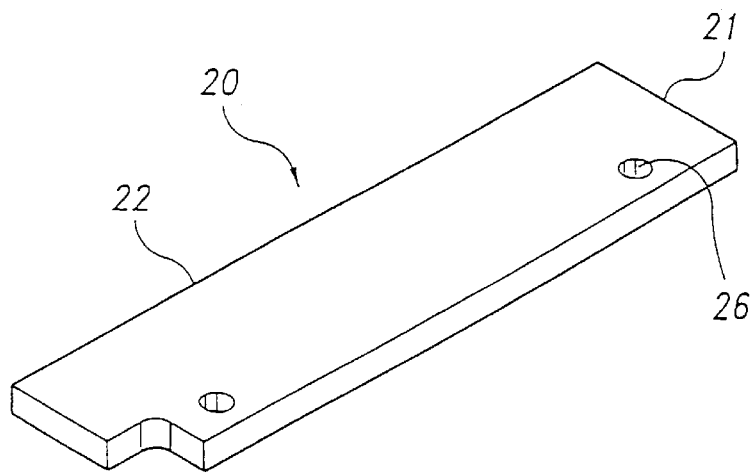
FIG. 2 is a perspective view for schematically showing a typical PCB for a semiconductor module.
Figure 3:
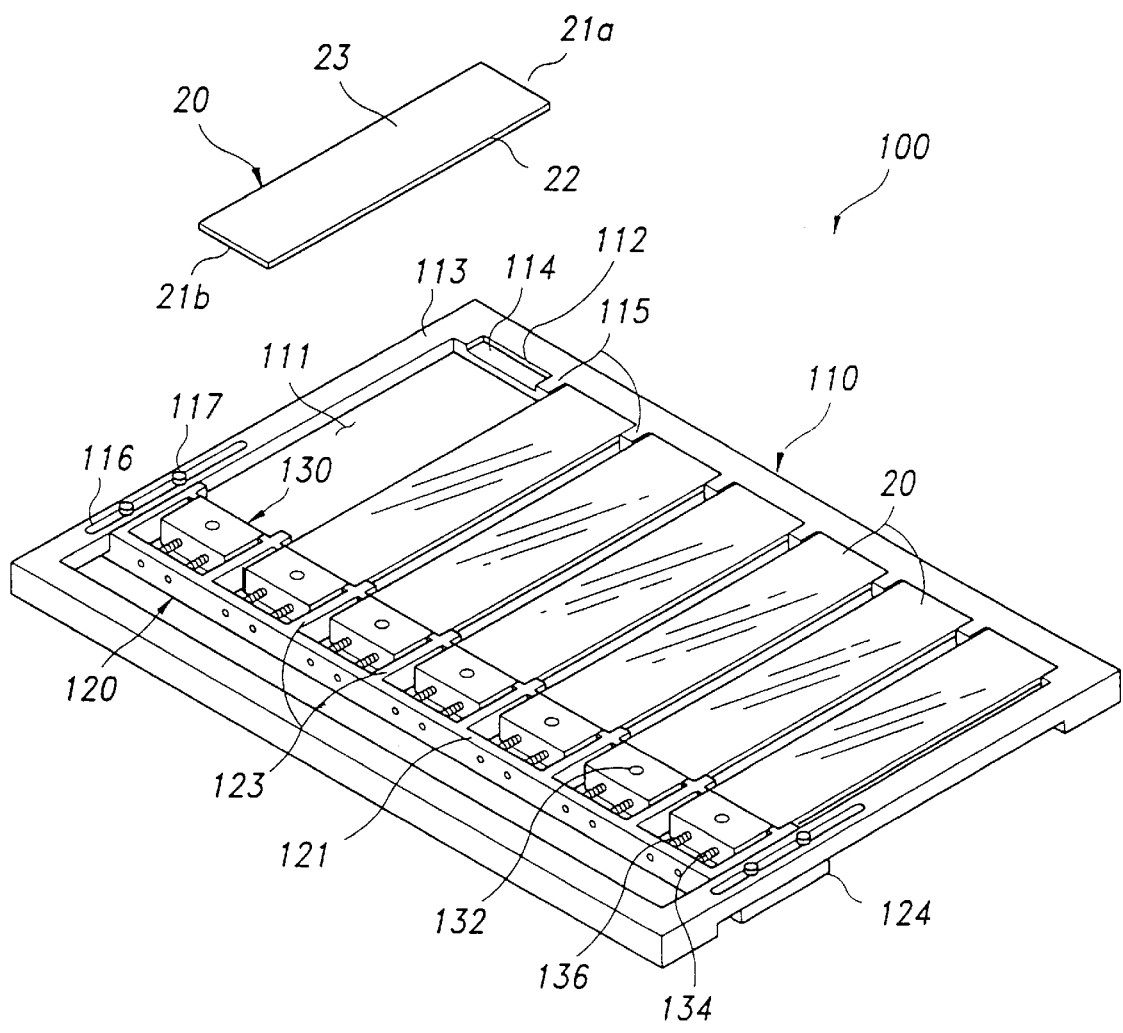
FIG. 3 is a perspective view of a jig carrier employed to carry multiple PCBs for an apparatus or a method according to the present invention.

FIG. 3 is a perspective view of a jig carrier 100 employed to carry a plurality of printed circuit boards (PCBs) 20 for semiconductor modules. Referring to FIG. 3, each of the PCBs 20, which are carried by the jig carrier 100, has two opposite plane surfaces 23, two opposite shorter edges 21a and 21b, and two opposite longer edges 22. The jig carrier 100 permits automatic loading or unloading processes of the present invention, as will be described later.

The jig carrier 100 comprises a rectangular main frame 110, a clamp frame 120 and at least one clamps 130, preferably of the same number as the PCBs 20. The main frame 110 is formed with an inside space 111 for the PCBs 20. When the PCBs 20 are in the jig carrier 100, a first shorter edge 21a of each PCB 20 is in each of receivers 114 which have an inside wall 112. The receivers 114 are preferably notches or ledges that are divided by sub-walls 115, and thus each of the sub-walls 115 together with associated inside wall 112 and receiver 114 can support a respective one of the PCBs 20. The width of each receiver 114, which is determined by two adjacent sub-walls 115, is preferably greater than that of the shorter edge 21a or 21b of the PCB 20. This permits the jig carrier 100 to admit various PCBs 20 having different lengths along the shorter edge 21.

The clamp frame 120 is mechanically joined to the main frame 110 by at least one fasteners 117. Preferably, the two frames 110 and 120 are attached at both parallel sides 113 of the main frame 110 and both ends 124 of the clamp frame 120. Both sides 113, which are perpendicular to the side of the main frame 110 containing the receivers 114, include an adjustable mounting such as a locking slot 116 for the fasteners 117. On the other hand, on both ends 124 of the clamp frame 120, one or more holes (not shown) are formed for the fasteners 117.

The locations of the fasteners 117 are limited to the holes of the frame ends 124, but can freely move in the locking slot 116. That is to say, the clamp frame 120 has a degree of freedom of movement within the slot 116. This allows the jig carrier 100 to carry PCBs 20 of different lengths along the longer edge 22. A plurality of locking holes formed at regular intervals can be alternatively used as the adjustable mounting, but is not shown in drawings. In this case, although the locking holes provide a less free movement of the clamp frame 120 than the above locking slot, locking holes may simplify the task of adjusting the location of the clamp frame 120 according to the size of the PCB 20.

The clamp frame 120 includes a fixed wall 121 and a support plate 122 (shown in FIG. 4C), which traverse the inside space 111 parallel to the side of the receivers 114 in the main frame 110. The support plate 122 supports a second shorter edge 21b opposite to the first edge 21a. On the other hand, the fixed wall 121 is provided for suspending the clamps 130. The clamps 130 will be described below.

The support plate 122 preferably has multiple partition walls 123 thereon. Each partition wall 123 corresponds to a respective one of the sub-walls 115 of the main frame 110. Therefore, when a PCB 20 is loaded into the jig carrier 100, the partition wall 123 and the sub-wall 115 can support one longer edge 22 of the PCB 20, while the support plate 122 and the receiver 114 support the bottom of the plane surfaces 23 at the short edges 21a and 21b. As a result, the PCBs 20 lie horizontally in the jig carrier 100 with the top plane surface 23 of each PCB 20 facing upward. Similarly to the sub-walls 115, the distance between two adjacent partition walls 123 is preferably greater than the width of the shorter edge 21a or 21b of the PCB 20. Accordingly, if the PCB 20 has a smaller width, the PCB 20 is supported by the only one of two adjacent partition walls 123 and the only one of two adjacent sub-walls 115.

The clamps 130 are located in the inside space 111 in the main frame 110, more particularly in a space between the fixed wall 121 and the support plate 122. In addition, the clamps 130 are elastically connected to the fixed wall 121. The elastic connection between the clamps 130 and the clamp frame 120 is preferably made by slide bars 134 and corresponding elastic members 136 such as springs.

Each slide bar 134 is horizontally inserted into the support plate 122, penetrates an opening in an associated clamp 130, and is horizontally fixed to the fixed wall 121. Therefore, the clamps 130 may freely move along the slide bars 134. However, the movement of the movable clamps 130 is limited by the elastic members 136 which are added to the slide bars 134 between the clamps 130 and the fixed wall 121. That is to say, the clamps 130 are pushed by elastic force of the elastic members 136, rather than being freely movable. Accordingly, when the PCBs 20 are loaded into the jig carrier 100, the clamps 130 push the second shorter edge 21b of the PCBs 20 toward the receivers 114 of the main frame 110, so that the PCBs 20 are firmly fixed to the jig carrier 100 by the clamps 130 and the main frame 110.

Figure 4A:
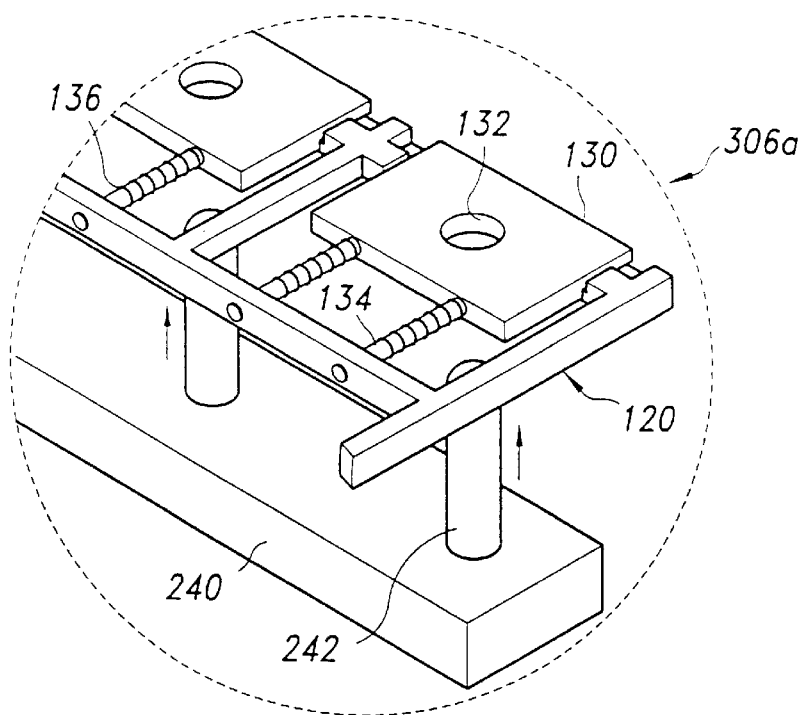
FIGS. 4A to 4D are a sequence of perspective views for partially illustrating a process for loading PCBs into the jig carrier of FIG. 3.

A process of loading the PCBs 20 into the jig carrier 100, in association with the operation of the movable clamps 130, is depicted in FIGS. 4A to 4D. In the following description, some of the elements or reference numerals which are the same as those in FIG. 3 are omitted in FIGS. 4A to 4D. FIG. 4A shows a state of the clamps 130 when the jig carrier 100 is empty, namely, before the loading of the PCBs 20. On this occasion, the movable clamps 130 are at a maximum extension toward the support plate 122 (shown in FIG. 4C).

A jig opener 240 is under the clamps 130. The jig opener 240, which comprises a loading or unloading apparatus of the present invention and is described below, applies opening force to the clamps 130 to open the jig carrier 100. In order to load or unload the PCBs 20 into or from the jig carrier 100, the jig opener 240 moves the movable clamps 130 in the reverse direction of the elastic force, i.e., towards the fixed wall 121. In connection with this, the clamps 130 preferably have vertical holes 132, and the jig opener 240 preferably has opening pins 242 as shown in FIGS. 4A to 4D. The opening pins 242 can move the clamps 130 by means of mechanical force, being inserted into the corresponding holes 132.

Figure 4B:
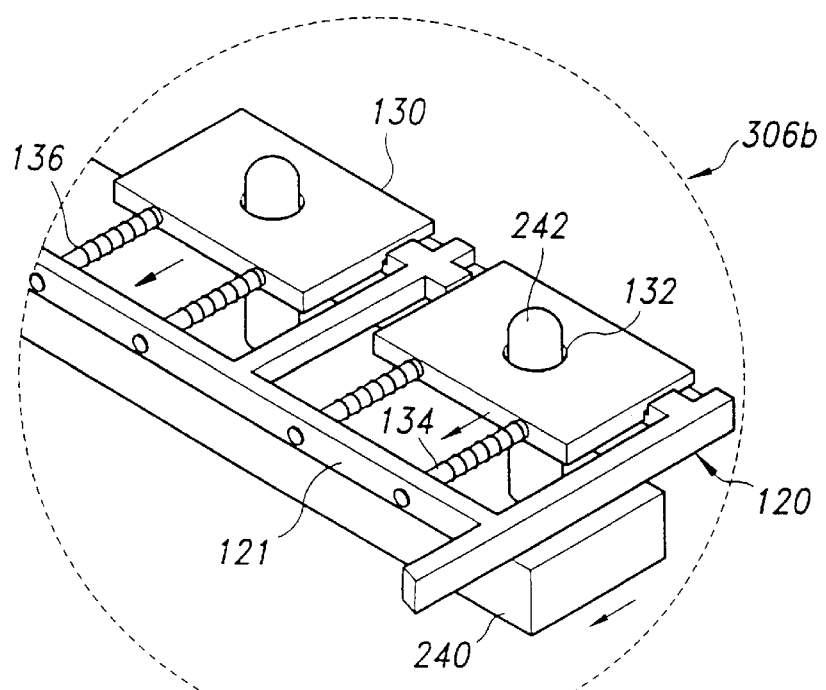

FIG. 4B shows the inserted opening pins 242. As seen from FIG. 4B, the jig opener 240 moves up to insert the opening pins 242 into the clamp holes 132 of the clamps 130. The jig opener 240 and the pins 242 move horizontally toward the fixed wall 121 of the clamp frame 120, so that the clamps 130 also move along the slide bars 134 and compress the elastic members 136.

Figure 4C:
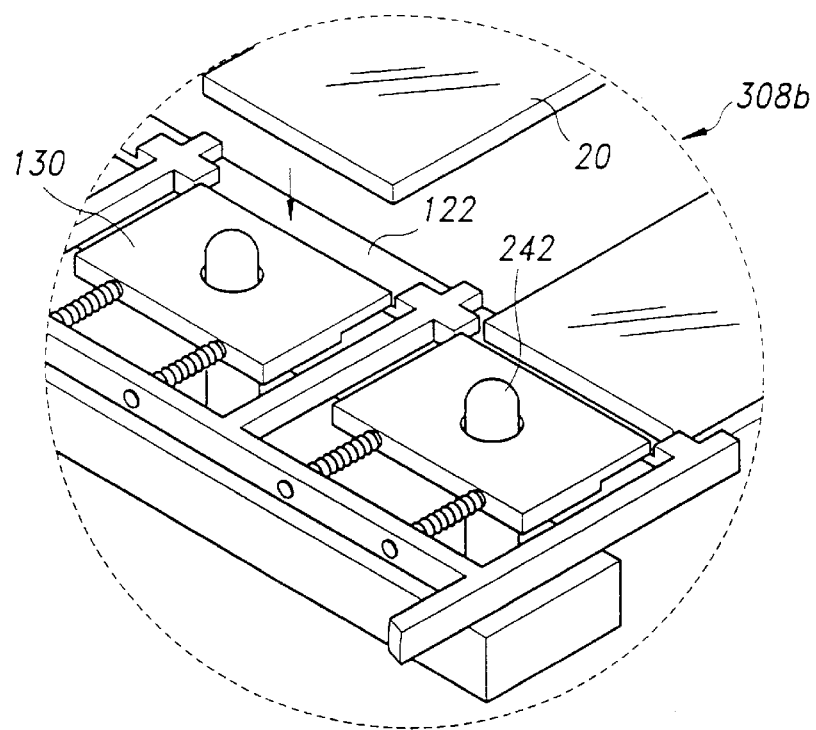
Figure 4D:
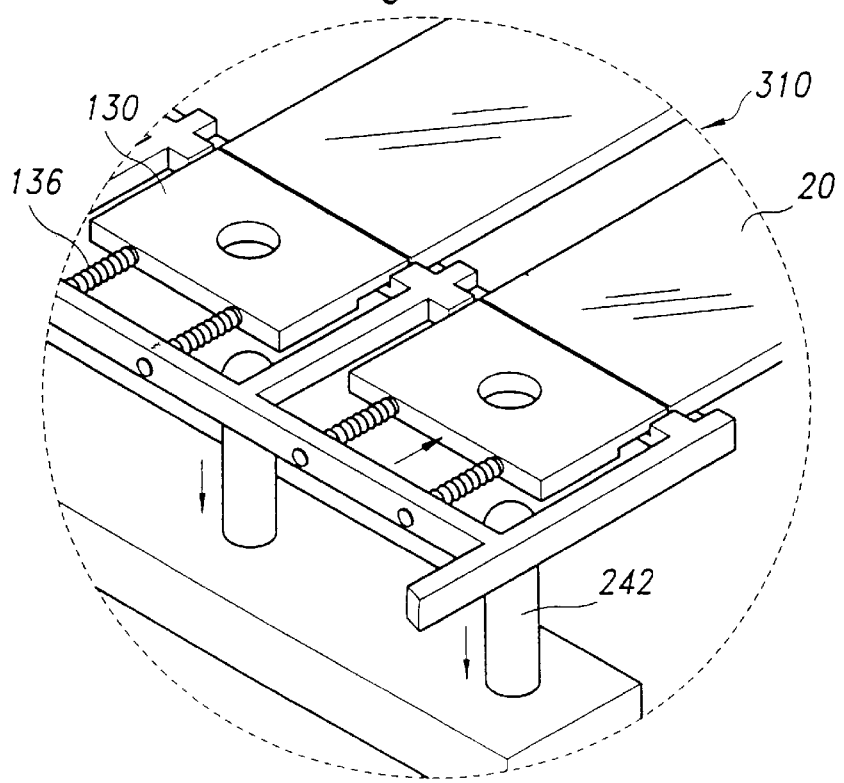

As depicted in FIG. 4C, an area large enough to admit the PCBs 20 is provided between the clamps 130 and the main frame 110 so that the PCBs 20 can be loaded into the jig carrier 100. After all the PCBs 20 are loaded into the jig carrier 100, the opening pins 242 move down, as illustrated in FIG. 4D. At the same time, elastic force from the elastic members 136 in the absence of the opening force push the clamps 130 and PCBs 20. Accordingly, the PCBs 20 are firmly fixed to the jig carrier 100.

Although only the automatic loading process is described above, an automatic unloading process can be performed in the reverse order of the above loading process. The reference numerals 306a, 306b, 308b, and 310 in FIGS. 4A to 4D refer to several steps of the overall loading process of the present invention, as is described below.

Figure 5:
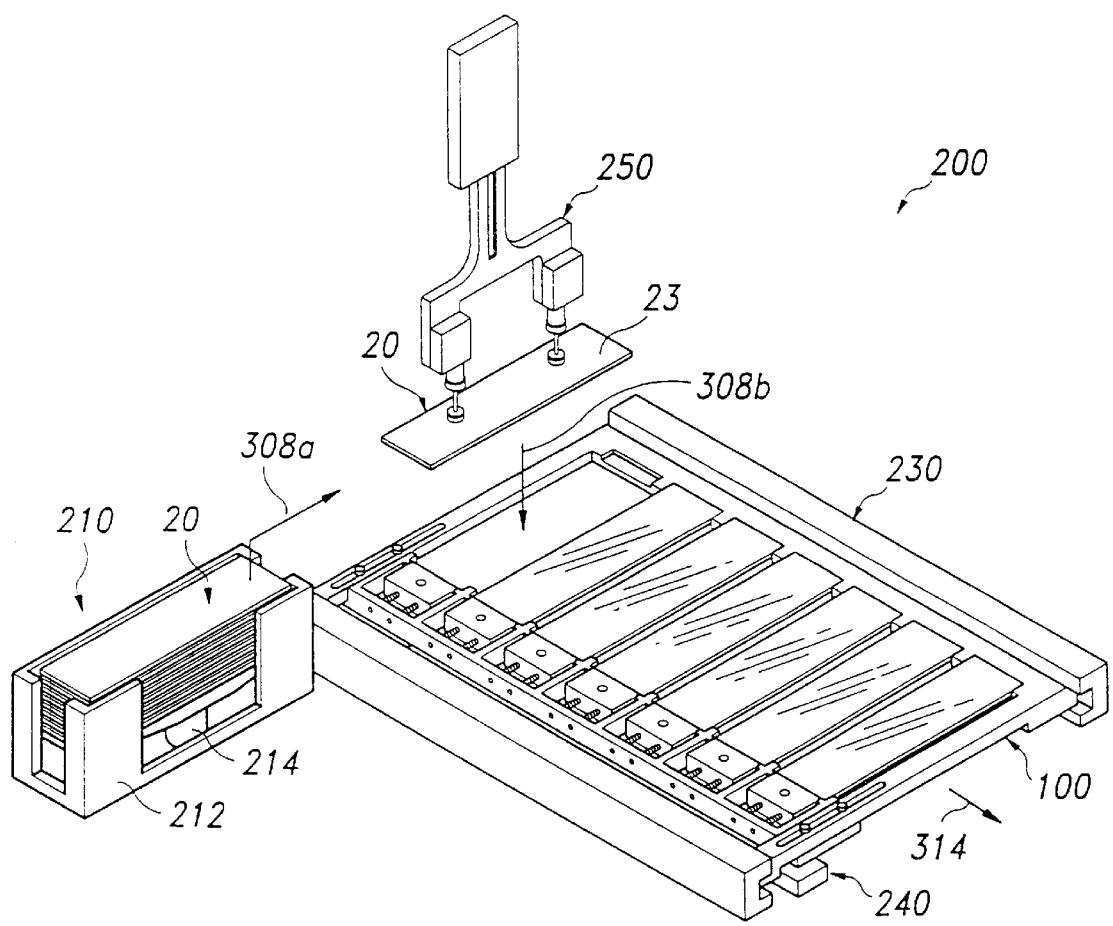
FIG. 5 is a schematic view of one embodiment of an apparatus for loading or unloading PCBs into or from the jig carrier of FIG. 3 according to the present invention.

The PCBs 20, which are employed in the manufacture of the semiconductor modules, are loaded into the above-described jig carrier and then provided to the module manufacturing line. The invented jig carrier not only allows use of an automatic loader or unloader, but also facilitates automation of a loader or unloader An automated loader or unloader according to the present invention is described below. One embodiment of an automated loader or unloader is shown in FIG. 5. The apparatus 200 of FIG. 5 shows the loading process only, but unloading processes are possible as well.

As shown in FIG. 5, the apparatus 200 loads the PCBs 20 into the jig carrier 100. The PCBs 20 are supplied in a PCB stage 210 which includes a PCB container 212 and an elevator 214. The PCBs 20 in the PCB stage 210 lie horizontally so that one of plane surfaces 23 of each PCB 20 faces upward. Therefore, a picker 250 can pick up the plane surface 23 of the PCBs 20 from the PCB stage 210 one by one and then horizontally place the PCBs 20 into the jig carrier 100. The picker 250 runs between the PCB stage 210 to the jig carrier 100 and loads the PCBs 20 one by one. A vacuum effector, which uses a low pressure to attract and fix the PCBs 20, may be preferably used as the picker 250. The picker 250 can load the PCBs 20 into the jig carrier 100 from the other element as well as to unload the PCBs 20.

The jig opener 240, as shown in FIGS. 4A to 4D, is under the jig carrier 100. The jig carrier 100 is transferred along a conveyor belt 230 from a jig stage (not shown) where the jig carrier 100 is supplied. The jig opener 240 operates as described above. Either the PCB stage 210 or the jig stage can be employed as storing stage of the PCBs 20 or the jig carrier 100 for an unloader. Moreover, the jig opener 240 and the picker 250 can be also used for the unloader. The directions of movement 308a, 308b, and 314 in FIG. 5 refer to steps of picking up the PCBs 20, placing the PCBs 20, and transferring the jig carrier 100, respectively, of the loading process of the present invention. For unloading, those directions are reversed.

Figure 6:
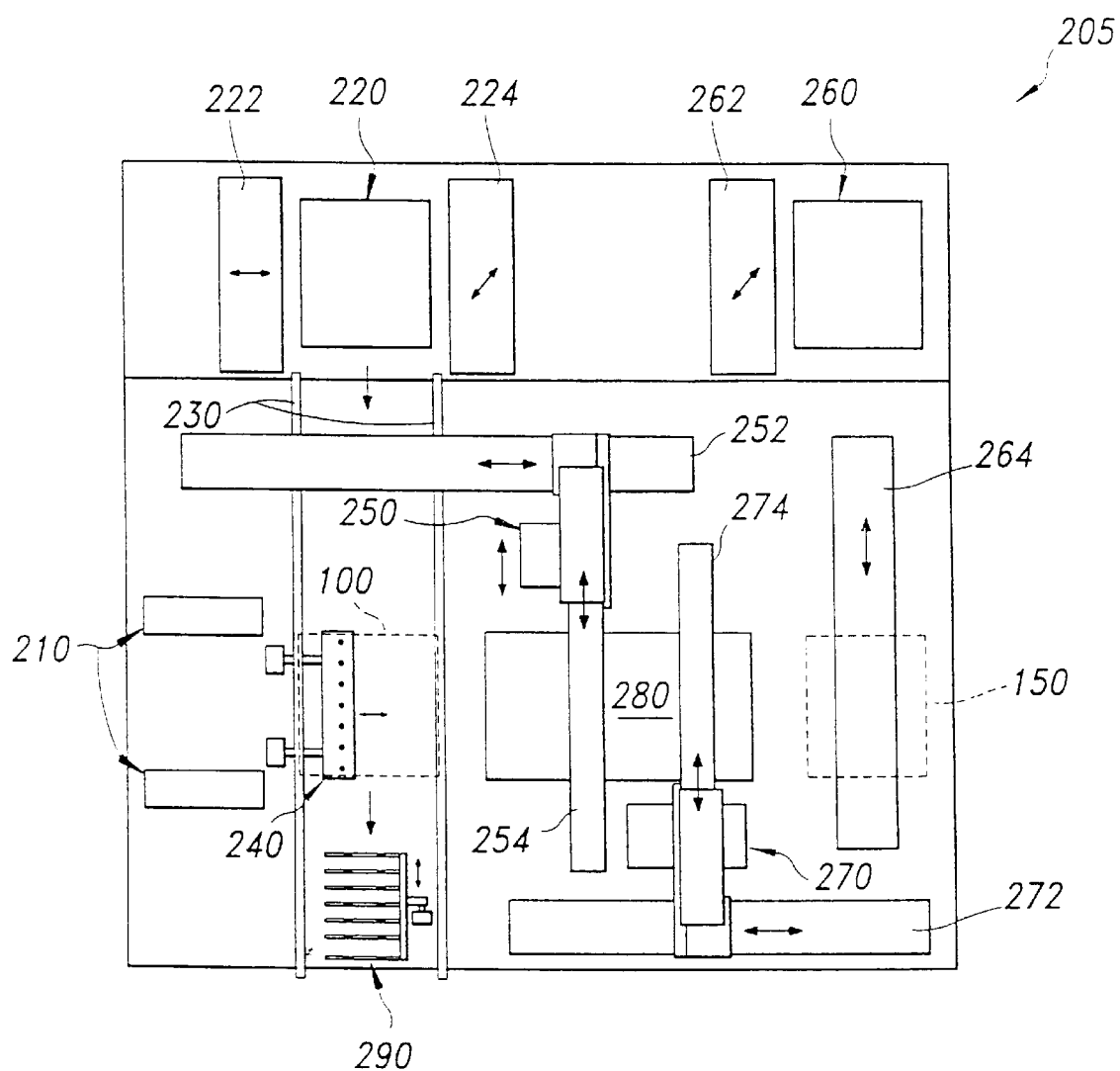
FIG. 6 is a schematic view of another embodiment of an apparatus for loading or unloading PCBs into or from the jig carrier according to the present invention.
Figure 7:
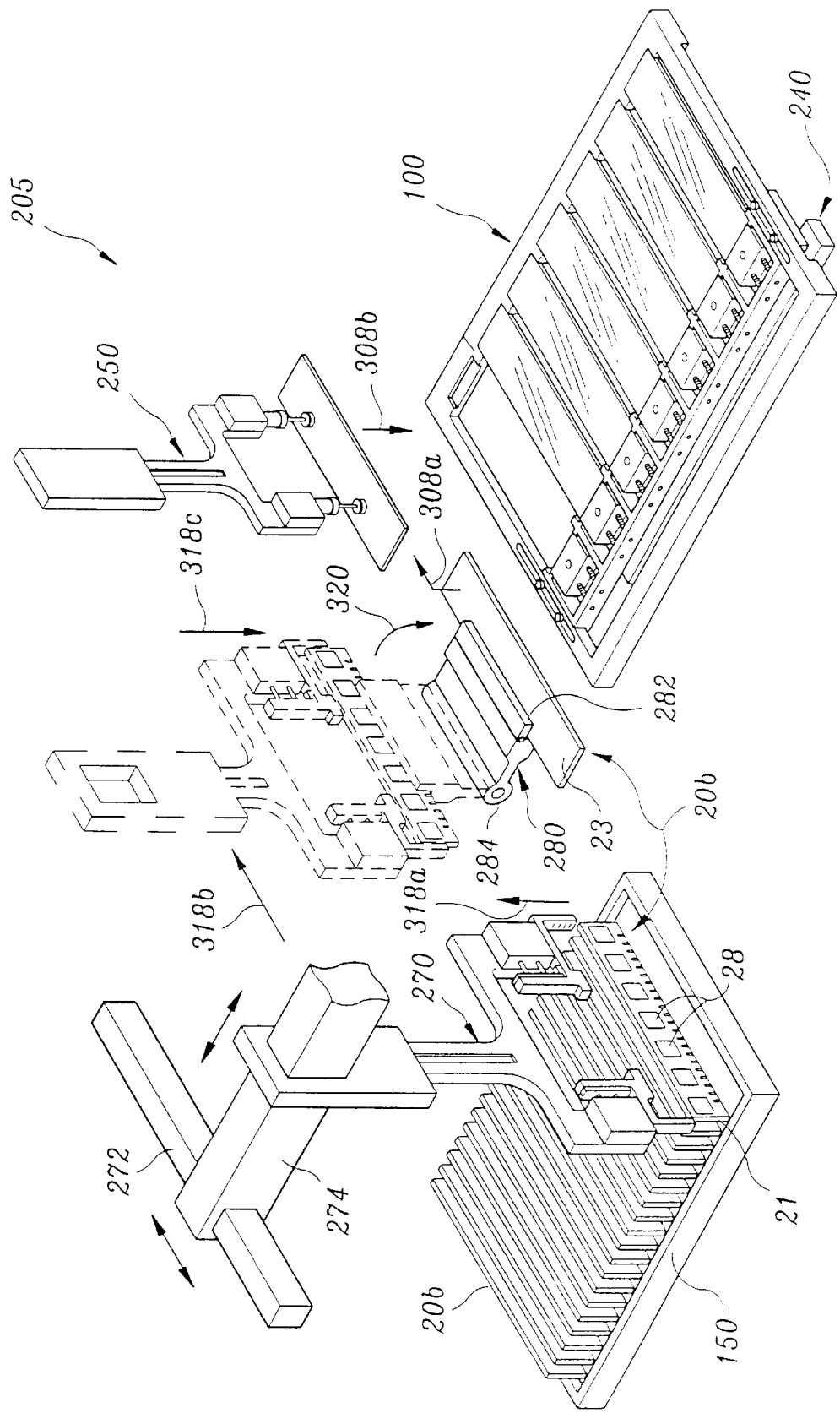
FIG. 7 is a perspective view for schematically illustrating a loading process in the loading apparatus of FIG. 6.

FIG. 6 schematically shows another embodiment of an apparatus 205 according to the present invention; and FIG. 7 illustrates a loading process in the apparatus 205 of FIG. 6. Although the apparatus 205 of this embodiment can be employed as an unloader, the following description mainly focuses on use of apparatus 205 for loading. With reference to FIGS. 6 and 7, the apparatus 205 comprises the PCB stage 210, the jig stage 220, the conveyor belt 230, the jig opener 240 and the picker 250, like the above embodiment. However, the apparatus 205 of this embodiment further comprises a tray stage 260, a gripper 270, a rotator 280 and an aligner 290, which are described below.

The PCBs supplied to the loader are divided into two classes: bare PCBs, such as PCBs 20 of FIGS. 3 to 5, having no devices on either surface; and single-sided module PCBs, such as PCBs 20b shown in FIG. 7, having devices 28 on the only one surface. Bare PCBs 20 are supplied to the PCB stage 210 of the apparatus 205, whereas singleside module PCBs 20b are supplied to the tray stage 260, being contained in a tray 150. In addition, the bare PCBs 20 in the PCB stage 210 lie horizontally so that one of the plane surfaces 23 may face upward, whereas the single-sided module PCBs 20b in the tray 150 stand upright so that the plane surfaces 23 may face sideways. In case of the loader, the supply of the bare PCBs 20 is always required regardless of module type, i.e., for single-sided or the double-sided modules, whereas the supply of the single-sided module PCBs 20b is required for the manufacture of only double-sided modules. In case of the unloader, the PCB stage 210 and the tray stage 260 can store the unloaded PCBs 20 or 20b.

The jig stage 220 is where the jig carrier 100 is supplied (in the loader) or is stored (in the unloader). The jig stage 220 includes a pusher 222 and an elevator 224. When the jig carrier 100 is ready in front of the conveyor belt 230 by the elevator 224, the pusher 222 pushes the jig carrier 100 onto the conveyor belt 230. The tray stage 260 includes an elevator 262 and a transfer rail 264. Similarly to the jig stage 220, the tray 150 in the tray stage 260 is transferred by the elevator 262 and the transfer rail 264 to a position for loading, as shown in FIGS. 6 and 7. Alternatively, transfer rail 264 can be eliminated, and the tray stage 260 can be at the position of the tray 150 as represented by dotted block in FIG. 6.

Although the jig stage 220 and the tray stage 260, including the pusher 222, the elevators 224 and 262, and the transfer rail 264, are illustrated as blocks in FIG. 6, in light of this disclosure, one skilled in the art will understand how to make and use such stages 220 and 260 . Furthermore, various alternative structures will be apparent in view of this disclosure. For example, instead of the conveyor belt 230 and the transfer rail 264, other transferring means well known in the art can be alternatively used.

After the jig carrier 100 is transferred to a position above the jig opener 240 along the conveyor belt 230, the jig carrier 100 is loaded with either the bare PCBs or the single-sided module PCBs, in case of the loader. Since the loading process of the bare PCBs was described above with reference to FIG. 5, only the loading process of the single-sided module PCBs is described below.

When the tray 150 in which PCBs 20b stand upright is in position, the gripper 270 grips the short edges 21 of the PCBs 20b one by one. In succession, the gripper 270 transfers the upright PCB 20b to the rotator 280. For this, the gripper 270 runs from the tray 150 to the picker 250. This movement of the gripper 270 is possible due to robot arms 272 and 274. One robot arm 272 is a fixed arm which extends from the tray 150 to the picker 250, while the other robot arm 274 is a moving arm which can move along the fixed arm 272. Moreover, the gripper 270 itself can run along the moving arm 274 so as to grip the PCBs 20b in the tray 150 one by one. The picker 250 may also include robot arms 252 and 254, as depicted in FIG. 6, which are the same as robot arms 272 and 274.

The rotator 280 is located between the gripper 270 and the picker 250. Once the rotator 280 receives the upright PCB 20b from the gripper 270, the rotator 280 rotates the PCB 20b to horizontal. The picker 250 can pick up the horizontal PCB 20b. The rotator 280 includes a movable holder 282 for holding the PCB 20b during rotation about an axis 284. After the pick-up step by the picker 250, the process is same as the above-description. The reference numerals 318a, 318b, 318c, 320, 308a and 308b in FIG. 7 are described below.

Figure 8:
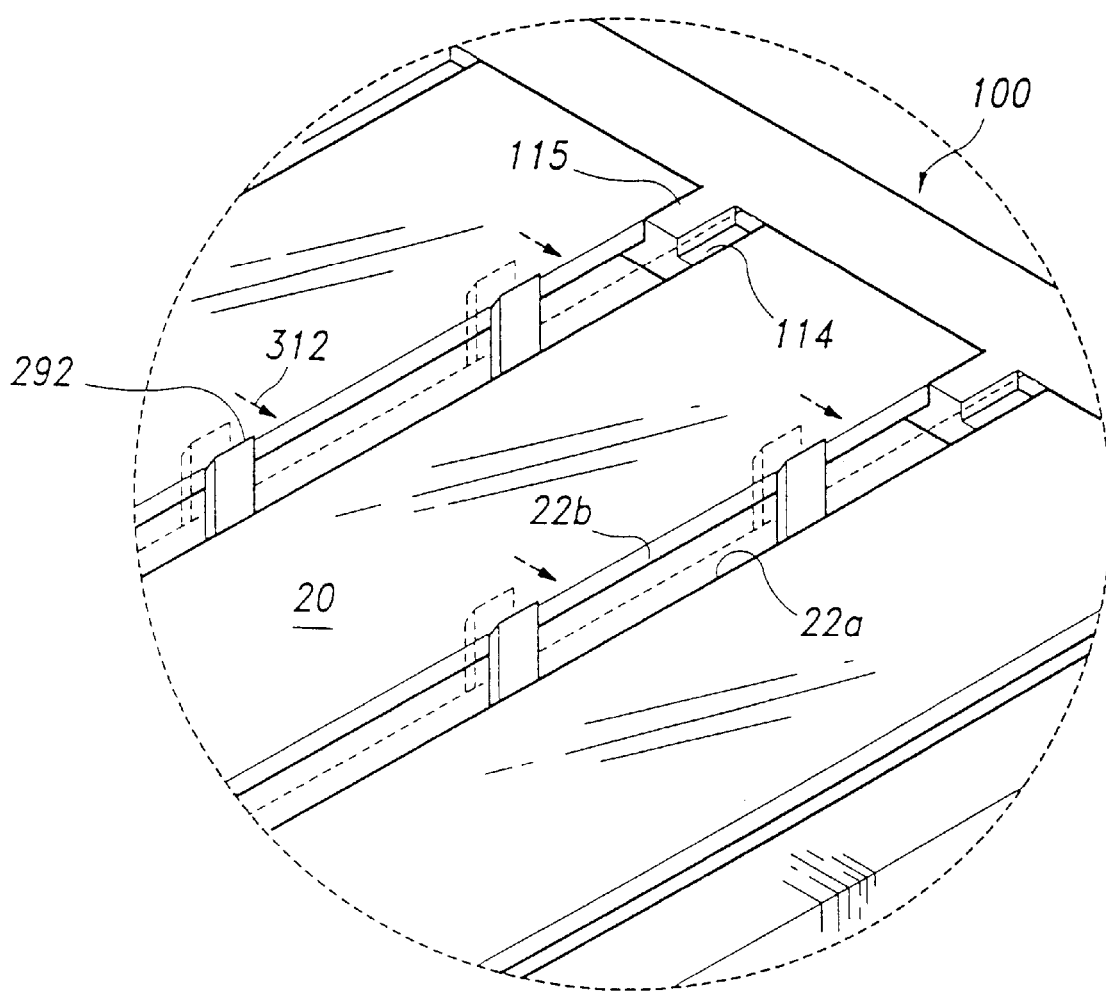
FIG. 8 is a perspective view for schematically showing an alignment process by an aligner of the loading apparatus of FIG. 6.

The apparatus 205 of this embodiment further comprises an aligner 290. The aligner 290 is at the exit of the conveyor belt 230 in the apparatus 205, that is, between the jig opener 240 and module manufacturing line (not shown). The aligner 290 finely aligns the PCBs 20 or 20b in the jig carrier 100 before the jig carrier 100 is supplied to the manufacturing line. An alignment action 312 is shown in FIG. 8. As shown in FIG. 8, the aligner 290 includes pushers 292. Every pusher 292 is inserted to a space between the longer edges 22a and 22b of two adjacent PCBs 20, and then pushes one of two adjacent PCBs 20 toward a sub-wall 115 and a partition wall (not shown in FIG. 8, but shown in FIG. 3).

For the unloading, the above-described gripper 270 transfers the PCBs 20b from the rotator 280 to the tray 150. The aligner 290 may be not required for unloading. Including this, the operation of the unloader is the reverse of the above-described operation of the loader. The apparatus of the present invention is thus not limited to loading, but is also capable of unloading.

Figure 9:
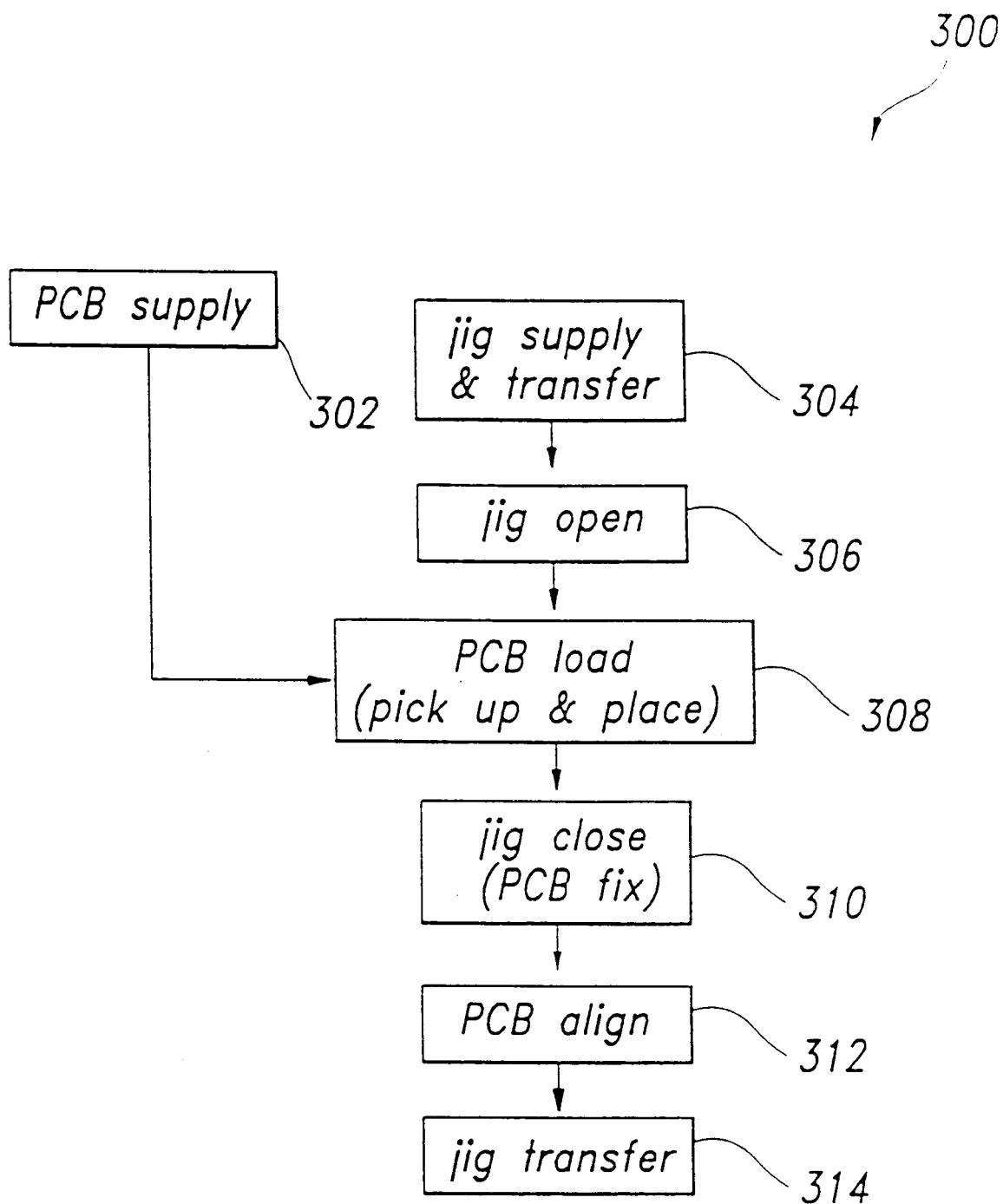
FIG. 9 is a flow chart for illustrating one embodiment of a loading method according to the present invention.
Figure 10:
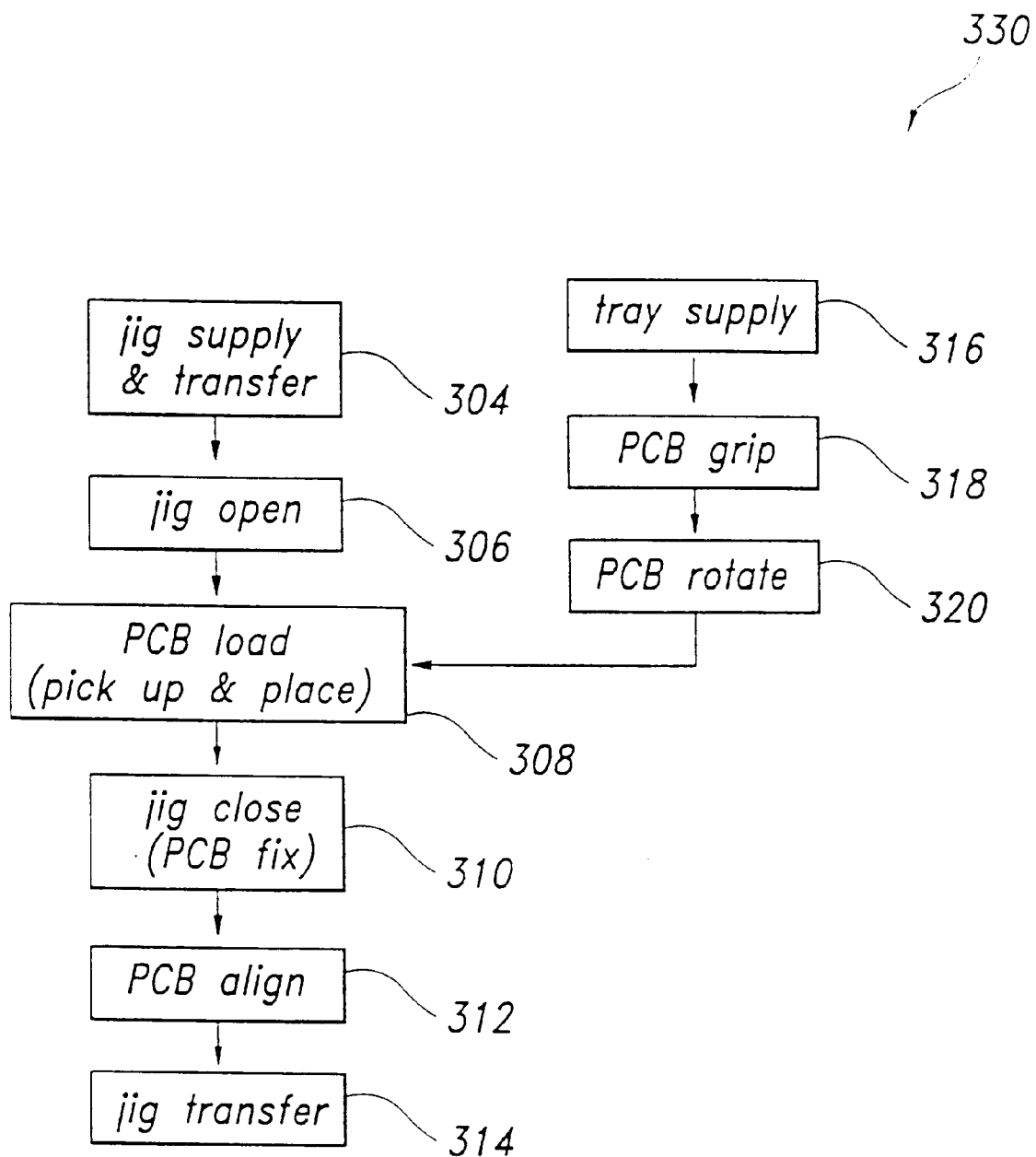
FIG. 10 is a flow chart for illustrating another embodiment of a loading method according to the present invention.

FIGS. 9 and 10 are flow charts for illustrating two embodiments of an overall loading method according to the present invention. Although the description of the automatic loading method according to the present invention has been already made in connection with the description of the loader, it is again set forth from now with reference to FIGS. 9 and 10. Structural reference numerals cited hereinafter designate the same structural element as described above.

One embodiment of the invented loading process 300 starts from a step 302 of supplying the PCBs 20 to the PCB stage 210 and a step 304 of supplying the jig carrier 100 to the jig stage 220, as illustrated in FIG. 9. The jig carrier 100 is then transferred from the jig stage 220 along the conveyor belt 230 to jig opener 240 for loading with the PCBs 20. Once the jig carrier 100 is transferred, the jig opener 240 opens the jig carrier 100 (step 306). This step 306 includes sub-steps 306a and 30b, as shown in FIGS. 4A and 4B. That is to say, the opening pins 242 move up into the holes 132 in the movable clamps 130 (sub-step 306a), and then horizontally move in the direction opposite to the elastic force of the elastic members 136 so as to open the jig carrier 100 (sub-step 306b).

While the jig carrier 100 opens, the picker 250 loads the PCBs 20 into the opened jig carrier 100 (step 308). This step 308 includes a first sub-step 308a of picking up the PCBs 20 from the PCB stage 210 and a second sub-step 308b of placing the PCBs 20 into the jig carrier 100, as shown in FIG. 5 or FIG. 4C. After the loading step 308, the jig carrier 100 is closed, i.e., the PCBs 20 are fixed, as shown in FIG. 4D, as a result of the opening pins 242 moving downward (step 310). In succession, the closed jig carrier 100 may be preferably subjected to an alignment step 312, as illustrated in FIG. 8. The PCBs 20 in the jig carrier 100 are exactly aligned so that one longer edge 22a of each PCB 20 is in contact with an associated sub-wall 115 and an associated partition wall 123 of the jig carrier 100. Finally, the step 314 transfers the jig carrier 100 to the module manufacturing line, as seen in FIG. 5.

As shown in FIG. 10, another loading process 330 starts from a step 316 of supplying the tray 150 to the tray stage 260 and a step 304 of supplying the jig carrier 100 to the jig stage 220. The jig carrier 100 is then transferred from the jig stage 220 along the conveyor belt 230 to the jig opener 240 for loading with the PCBs 20b. Once the jig carrier 100 is transferred, similar to the above embodiment, the jig opener 240 opens the jig carrier 100 (step 306). This step 306 includes sub-steps 306a and 306b, as described in the above embodiment.

While the jig carrier 100 is open, the loading process 330 is somewhat different from process 300. In both processes, the picker 250 picks up a PCB 20 or 20b (step 308a) and then places the PCB into the jig carrier 100 (step 308b), but in process 330, the picker 250 picks up the PCBs 20b from rotator 280, not from the PCB stage 210 as in process 300. The PCBs 20b stand upright in the tray 150, therefore, the PCBs 20b must be rotated so that the picker 250 can pick up the horizontal PCBs 20b. For this, as seen from FIG. 7, the gripper 270 grips the PCBs 20b in the tray 150 and then moves up (step 318a), and the gripper 270 is transferred to the rotator 280 by the moving arm 274 (step 318b), and moves down (step 318c). These sequential steps 318a to 318c form the grip step 318 of FIG. 10. After the grip step 318, the rotator 280 receives the upright PCBs 20b from the gripper 270 and then rotates (step 320), so that the picker 250 can pick up the horizontal PCBs 20b.

Remaining steps, i.e., the jig close step 310, the PCB alignment step 312 and the jig transfer step 314, after the above sequential loading steps 318, 320 and 308 are the same as described above.

Figure 11:
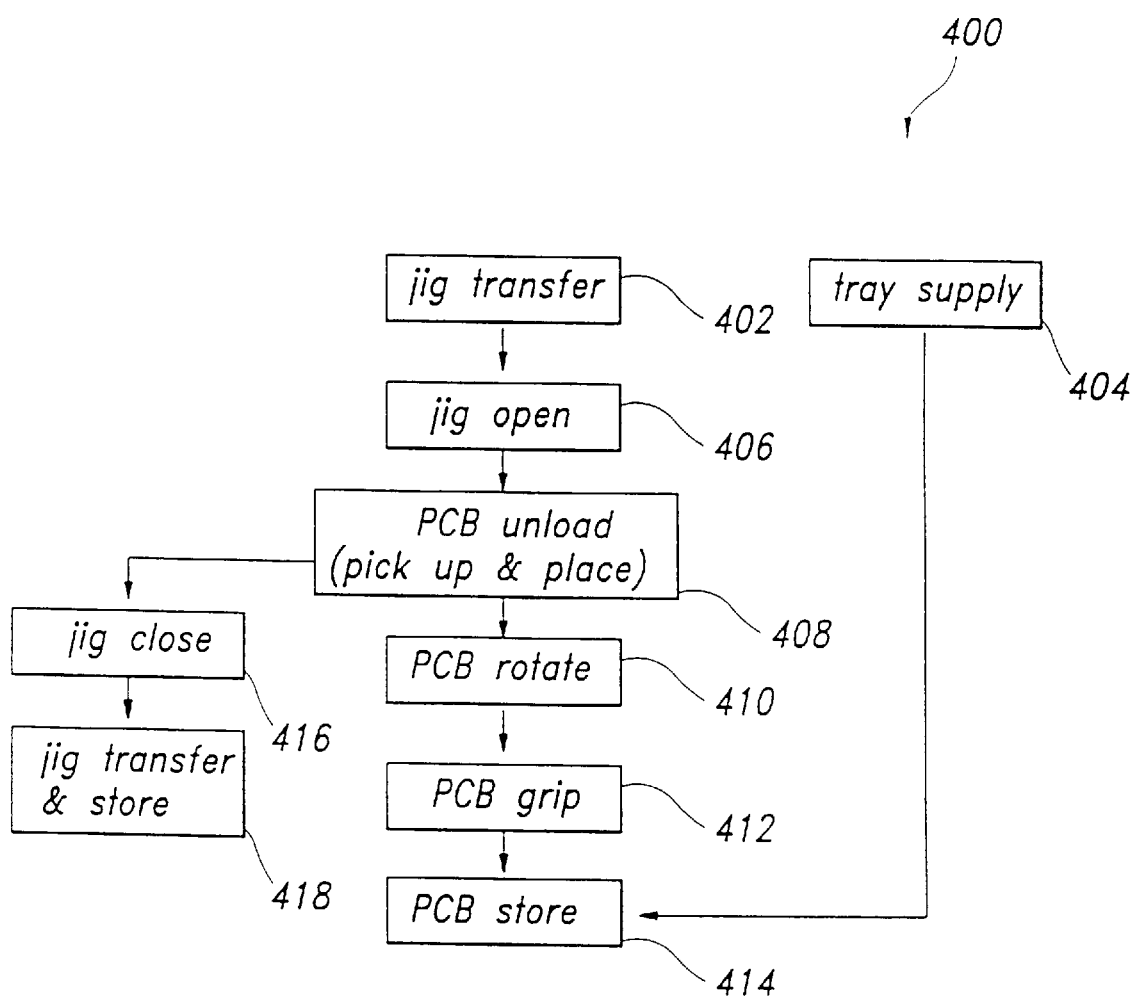
FIG. 11 is a flow chart for illustrating an unloading method according to the present invention.

FIG. 11 is a flow chart for illustrating an unloading process 400 according to an embodiment of the present invention. As shown in FIG. 11, the unloading process 400 starts with a step 402 of transferring a jig carrier containing PCBs to the jig opener along the conveyor belt. Simultaneously, the tray is supplied to the tray stage for storage of the PCBs (step 404). The next step is a jig opening step 406. In step 406, the jig opener opens the jig carrier, so that the PCBs in the jig carrier can be unloaded from the jig carrier. An unloading step 408 is performed by the picker. The picker picks up a PCB from the jig carrier and then places the PCB into the rotator. The rotator rotates after receiving the PCB from the picker, so that the PCB is upright for the gripper (step 410). The gripper grips the upright PCB in the rotator and then places it into the tray, so that the PCBs are collected and stored in the tray (step 414). After the last PCB is removed, the jig carrier from which the PCBs have been unloaded is closed (step 416). Finally, the closed jig carrier is transferred and then stored for another loading.

To use of the invented loader or unloader together with the jig carrier results in automatic manufacture of modules with low cost. In other words, the use of the individual PCBs in the manufacture of modules becomes possible or improved with higher productivity. In addition, the automated process of loading or unloading may not only eliminate the possibility of damage during management of the module PCBs, but also prevents the problems associated with electronic discharge from workers.

In the drawings and specification, there have been disclosed typical preferred embodiments of the invention. Although specific terms are employed, they are used in a generic and descriptive sense only and not for purposes of limitation, the scope of the invention being set forth in the following claims.

What is claimed is:

1. An apparatus for automatically loading a plurality of printed circuit boards (PCBs) into a jig carrier, each of the PCBs having two opposite plane surfaces, two opposite shorter edges, and two opposite longer edges, said apparatus comprising:

a PCB stage where the PCBs are supplied;

a jig stage where the jig carrier into which the PCBs will be loaded is supplied, the jig carrier including:
  receivers for supporting a first shorter edge of the PCBs when the PCBs are loaded into the jig carrier;
  a support plate for supporting a second edge of the PCBs when the PCBs are provided for the jig carrier; and
  movable clamps provided with elastic connectors having elastic force, wherein for loading of the PCBs, the movable clamps are opened by an opening force in a direction opposite that of the elastic force, and wherein the movable clamps are closed by the elastic force in the absence of the opening force, whereby the PCBs when loaded into the jig carrier are fixed to the jig carrier by the elastic force when the clamps are closed;

a conveyor belt for transferring the jig carrier from said jig stage;

a jig opener located under said conveyor belt, said jig opener applying the opening force to the movable clamps when the jig carrier has been transferred along said conveyor belt, whereby said jig opener opens the movable clamps; and a picker running above said jig opener from said PCB stage, said picker picking up the PCBs from said PCB stage and then placing the PCBs into the jig carrier when the jig carrier is above said jig opener.

2. The apparatus according to claim 1, wherein:

the PCBs lie horizontally in said PCB stage with a top plane surfaces of each PCB facing upward; and said picker picks up the top plane surfaces of the PCBs so that the PCBs will be horizontally placed into the jig carrier.

3. The apparatus according to claim 2, further comprising:

a tray stage where a tray containing second PCBs is supplied, wherein the second PCBs stand upright in the tray, the plane surfaces of the second PCBs facing sideways.

4. The apparatus according to claim 3, wherein the second PCBs have multiple integrated circuit devices attached to one of the plane surfaces thereof.

5. The apparatus according to claim 3, further comprising:

a gripper running from said tray stage to said picker, said gripper gripping the second PCBs in the tray and then transferring the second PCBs from the tray, wherein said gripper grips the short edges of the second PCBs so that the second PCBs will be transferred upright; and a rotator located between said gripper and said picker, said rotator receiving the upright second PCBs from said gripper and then rotating the second PCBs to horizontal so that said picker can pick up the horizontal second PCBs.

6. The apparatus according to claim 1, further comprising:

an aligner located between said jig opener where the PCBs are loaded into the jig carrier and a manufacturing line, wherein said aligner has align pushers each of which is inserted to a space between the longer edges of two adjacent PCBs and then pushes one of two adjacent PCBs toward both a sub wall of one of said receivers and a partition wall of said support plate, so that the PCBs in the jig carrier are aligned against the sub walls and partition walls.

7. The apparatus according to claim 1, wherein each of the movable clamps has a hole vertically formed therethrough, and wherein said jig opener has opening pins which are inserted into corresponding holes of the clamps so that said opening pins can apply the opening force to move the clamps.

8. The apparatus according to claim 1, wherein said picker is a vacuum effector which attracts and fixes the PCBs by low pressure.

9. An apparatus for automatically unloading a plurality of printed circuit boards (PCBs) from an elastic jig carrier, each of the PCBs having two opposite plane surfaces and two opposite shorter edges and two opposite longer edges, said apparatus comprising:

a conveyor belt for transferring the elastic jig carrier into which the PCBs have been loaded, wherein the PCBs lie horizontally in the jig carrier, one of the plane surfaces of each PCB facing upward, the elastic jig carrier including:
  receivers supporting a first shorter edge of the PCBs, the receivers having sub-walls;
  a support plate supporting a second edge of the PCBs, the support plate having partition walls; and
  movable clamps provided with elastic connectors having elastic force, so that the movable clamps are closed by the elastic force to fix the PCBs to the jig carrier, wherein the movable clamps can be opened by an opening force in the reverse direction of the elastic force when the PCBs are unloaded from the jig carrier;

a tray stage where a tray is supplied, wherein the PCBs will stand upright in the tray, the plane surfaces of the PCBs facing sideways;

a jig opener located under said conveyor belt, said jig opener applying the opening force to the movable clamps when the jig carrier has been transferred along said conveyor belt, so that said jig opener opens the movable clamps;

a picker running above said jig opener, said picker picking up the PCBs from the jig carrier above said jig opener, wherein said picker picks up the plane surface of the PCBs to keep the PCBs horizontal;

a rotator located near said picker, said rotator receiving the horizontal PCBs from said picker and then rotating the PCBs to an upright orientation; and a gripper running from said rotator to said tray stage, said gripper gripping the upright PCBs in said rotator and then placing the PCBs into the tray, wherein said gripper grips the shorter edges of the PCBs so that the PCBs may be stored upright in the tray.

10. The apparatus according to claim 9, wherein each of the movable clamps has a clamp hole vertically formed therethrough, and wherein said jig opener has opening pins which are inserted into corresponding clamp holes of the clamps so that said opening pins can apply the opening force to move the clamps.

11. A method for automatically loading a plurality of printed circuit boards (PCBs) into a jig carrier, said method comprising:

supplying the PCBs to a PCB stage, each of the PCBs having two opposite plane surfaces, two opposite shorter edges, and two opposite longer edges, wherein the PCBs horizontally lie in the PCB stage, one of the plane surfaces of each PCB facing upward;

opening the jig carrier by a jig opener, wherein the jig carrier has movable clamps that close to fix the PCBs by elastic force, and wherein the jig opener applies opening force to the movable clamps in the reverse direction of the elastic force so that the PCBs can be loaded into the jig carrier;

loading the PCBs into the opened jig carrier from the PCB stage by a picker, said loading step including: picking up the PCBs from the PCB stage; and placing the PCBs into the jig carrier above the jig opener, wherein the picker picks up the plane surface of the PCBs and then places the PCBs horizontally, and wherein a first shorter edge of the PCBs is placed on receivers of the jig carrier, and a second shorter edge is placed on a support plate of the jig carrier; and closing the jig carrier in order to fix the PCBs, wherein the jig opener removes the opening force from the movable clamps so that the movable clamps apply the elastic force to the PCBs.

12. The method according to claim 11, further comprising:

supplying a tray for a tray stage so as to load a plurality of second PCBs into the jig carrier, wherein the second PCBs stand upright in the tray, the plane surfaces of the second PCBs facing sideways, and wherein the second PCBs are provided with multiple integrated circuit devices attached onto one of the plane surfaces thereof.

13. The method according to claim 12, further comprising:

gripping the second PCBs in the tray by a gripper, wherein the gripper grips the shorter edges of the second PCBs so that the second PCBs may be transferred upright; and rotating the second PCBs to horizontal using a rotator after receiving the upright second PCBs from the gripper, so that the horizontal second PCBs are provided for the picker.

14. The method according to claim 11, further comprising:

aligning the PCBs by an aligner after closing the jig carrier, wherein the PCBs in the jig carrier are aligned so that each PCB is in contact with an associated sub-wall and an associated partition wall of the jig carrier.

15. The method according to claim 11, wherein each of the movable clamps has a hole vertically formed therethrough, and the jig opener has opening pins, and wherein opening includes:

inserting the opening pins into the vertical holes in the clamps; and moving the opening pins in a direction opposite to that of the elastic force, wherein moving the opening pins applies the opening force that opens the movable clamps.

16. A method for automatically unloading a plurality of printed circuit boards (PCBs) from an elastic jig carrier, said method comprising:

transferring the elastic jig carrier, into which the PCBs have been loaded, to a jig opener along a conveyor belt, each of the PCBs having two opposite plane surfaces, two opposite shorter edges, and two opposite longer edges, wherein the PCBs lie horizontally in the jig carrier, one of the plane surfaces of each PCB facing upward, wherein the jig carrier includes receivers that support a first shorter edge of the PCBs and have sub-walls, wherein the jig carrier further includes a support plate that supports a second edge of the PCBs and has partition walls, and wherein the jig carrier still further includes movable clamps provided with elastic connectors that provide an elastic force that closes the movable clamps and fixes the PCBs to the jig carrier;

supplying a tray for a tray stage, wherein the PCBs will stand upright in the tray with the plane surfaces of the PCBs facing sideways;

opening the jig carrier by the jig opener located under the conveyor belt, wherein the jig opener applies opening force to the movable clamps when the jig carrier has been transferred along the conveyor belt, so that the jig opener opens the movable clamps so as to unload the PCBs from the jig carrier;

unloading the PCBs from the opened jig carrier by a picker, said unloading including: picking up the PCBs from the jig carrier; and placing the PCBs into a rotator near the picker, wherein the picker picks up the plane surface of the PCBs and then places the PCBs horizontally in order that the rotator may receive the horizontal PCBs;

rotating the PCBs by the rotator, so that the PCBs are upright for a gripper; and gripping the upright PCBs in the rotator and then placing the PCBs into the tray by the gripper, wherein the gripper grips the shorter edges of the PCBs so that the PCBs may be stored upright in the tray.

* * * * *